US012738761B1

(12) United States Patent
Nagabhushanrao et al.

(10) Patent No.: US 12,738,761 B1
(45) Date of Patent: Sep. 15, 2026

(54) HEALTH MONITORING OF A UPS BATTERY

(71) Applicant: SCHNEIDER ELECTRIC IT CORPORATION, Foxboro, MA (US)

(72) Inventors: Pradeep Tolakanahalli Nagabhushanrao, Bangalore (IN); Anil Cheniveettil Suresh, Malappuram Dt (IN)

(73) Assignee: Schneider Electric IT Corporation, Andover, MA (US)

( * ) Notice: Subject to any disclaimer, the term of this patent is extended or adjusted under 35 U.S.C. 154(b) by 0 days.

(21) Appl. No.: 19/079,982

(22) Filed: Mar. 14, 2025

(51) Int. Cl.
*H02J 9/06* (2006.01)
*G01R 31/36* (2020.01)
*G01R 31/392* (2019.01)
*H02M 1/42* (2007.01)

(52) U.S. Cl.
CPC ............ *H02J 9/06* (2013.01); *G01R 31/3647* (2019.01); *G01R 31/392* (2019.01); *H02M 1/4208* (2013.01)

(58) Field of Classification Search
CPC ..... H02J 9/06; G01R 31/392; G01R 31/3647; H02M 1/4208
USPC ........................................................... 307/66
See application file for complete search history.

(56) References Cited

U.S. PATENT DOCUMENTS 11,418,033 B2 8/2022 Demissie et al.
11,799,318 B2 10/2023 August et al.
11,955,833 B2 4/2024 Suresh et al.
2019/0267834 A1 8/2019 Catalano et al.
2024/0006912 A1 1/2024 Nagabhushanrao et al.

FOREIGN PATENT DOCUMENTS

EP 2 342 798 B1 9/2021
NZ 229639 A 3/1993

OTHER PUBLICATIONS

Extended European Search Report for application No. 26160656.0, mailed Aug. 7, 2026

*Primary Examiner* — Hal Kaplan

(74) *Attorney, Agent, or Firm* — Patterson + Sheridan, LLP

(57) ABSTRACT

An uninterruptible power supply includes a first input configured to be coupled to a primary power source (PPS); a power factor correction (PFC) converter coupled to the first input; a second input configured to be coupled to a secondary power source (SPS); a DC/DC converter coupled to the second input; an output configured to be coupled to a load; and at least one controller configured to control the DC/DC converter to provide secondary power derived from the SPS to the output, control, while an amount of power available from the PPS is sufficient to satisfy the load, the PFC converter to provide primary power derived from the PPS to the output in parallel with the DC/DC converter providing the secondary power to the output, receive at least one of a charge or discharge parameter associated with the SPS, and determine a state of health of the SPS based on the at least one of the charge or discharge parameter.

20 Claims, 7 Drawing Sheets

HEALTH MONITORING OF A UPS BATTERY

BACKGROUND

1. Field of the Disclosure

At least one example in accordance with the present disclosure relates generally to uninterruptible power supplies.

2. Discussion of Related Art

Power devices, such as uninterruptible power supplies (UPSs), may be used to provide regulated, uninterrupted power for sensitive and/or critical loads, such as computer systems and other data-processing systems. Examples of UPSs include online UPSs, offline UPSs, line-interactive UPSs, as well as others. UPSs may provide output power to a load. The output power may be derived from a primary source of power, such as a utility-mains source, and/or derived from a back-up or secondary source of power, such as an energy-storage device. The energy-storage device may include one or more batteries.

SUMMARY

Examples of the methods and systems discussed herein are not limited in application to the details of construction and the arrangement of components set forth in the following description or illustrated in the accompanying drawings. The methods and systems may be capable of implementation in other embodiments and of being practiced or of being carried out in various ways. Examples of specific implementations are provided herein for illustrative purposes and are not intended to be limiting. Acts, components, elements, and features discussed in connection with any one or more examples may be configured to operate and/or be implemented in a similar role in any other examples.

The phraseology and terminology used herein is for the purpose of description. References to examples, embodiments, components, elements, or acts of the systems and methods herein referred to in the singular may also embrace embodiments including a plurality. Similarly, references in plural to embodiments, components, elements, or acts may be implemented as a singularity. References in the singular or plural form may therefore not be intended to limit the presently disclosed systems or methods, their components, acts, or elements. The use herein of "including," "comprising," "having," "containing," "involving," and variations so forth, may encompass the items listed thereafter and equivalents thereof as well as additional items.

References to "or" may be construed as inclusive so that any terms described using "or" may indicate any of a single, more than one, and all of the described terms. For example, the phrase "at least one of A or B" may refer A and/or B—that is, A only, B only, or A and B together. In addition, in the event of inconsistent usages of terms between this document and documents incorporated herein by reference, the term usage in the incorporated documents is supplementary to this document. For irreconcilable differences, the term usage in this document controls.

According to at least one aspect of the present disclosure, in one example, an uninterruptible power supply (UPS) is disclosed. The UPS includes a first input configured to be coupled to a primary power source; a power factor correction (PFC) converter coupled to the first input; a second input configured to be coupled to a secondary power source; a DC/DC converter coupled to the second input; an output configured to be coupled to a load; and at least one controller configured to control the DC/DC converter to provide secondary power derived from the secondary power source to the output, control, while an amount of power available from the primary power source is sufficient to satisfy the load, the PFC converter to provide primary power derived from the primary power source to the output in parallel with the DC/DC converter providing the secondary power to the output, receive at least one of a charge or discharge parameter associated with the secondary power source, and determine a state of health (SOH) of the secondary power source based on the at least one of the charge or discharge parameter.

In one example of the UPS, the at least one controller is further configured to control the DC/DC converter to provide the secondary power based on a reference power. In one example of the UPS, controlling the DC/DC converter to provide the secondary power based on the reference power includes controlling the secondary power to match the reference power, and controlling the PFC converter to provide the primary power includes controlling the primary power to supplement the secondary power to satisfy the load.

In another example of the UPS, the at least one controller is further configured to control the DC/DC converter to stop providing the secondary power in response to determining the SOH.

In one example of the UPS, the at least one controller is further configured to control the DC/DC converter to stop providing the secondary power in response to receiving the at least one of the charge or discharge parameter.

In another example of the UPS, the at least one controller is further configured to control the DC/DC converter to provide the secondary power based on a reference power according to a predetermined time schedule. In one example of the UPS, the predetermined time schedule is periodic.

In one example of the UPS, the at least one controller is further configured to output the SOH of the secondary power source, wherein outputting the SOH of the secondary power source includes outputting an alarm signal in response to the SOH below a threshold value.

In another example of the UPS, the PFC converter includes an inductor coupled to a DC bus of the UPS; the at least one controller is further configured to control the DC/DC converter to provide the secondary power based on a reference power; and controlling the PFC converter to provide the primary power includes determining a current of the inductor based on the reference power and a voltage of the DC bus.

In one example of the UPS, the secondary power source includes one or more batteries.

According to at least another aspect of the present disclosure, at least one non-transitory computer-readable medium storing thereon sequences of computer-executable instructions for controlling an uninterruptible power supply (UPS) including a first input configured to be coupled to a primary power source, a power factor correction (PFC) converter coupled to the first input, a second input configured to be coupled to a secondary power source, a DC/DC converter coupled to the second input, and an output configured to be coupled to a load is disclosed, the sequences of computer-executable instructions including instructions that instruct at least one processor to control the DC/DC converter to provide secondary power derived from the secondary power source to the output; control, while an amount of power available from the primary power source is sufficient to satisfy the load, the PFC converter to provide primary power derived from the primary power source to the output in parallel with the DC/DC converter providing the secondary power to the output; receive at least one of a charge or discharge parameter associated with the secondary power source; and determine a state of health (SOH) of the secondary power source based on the at least one of the charge or discharge parameter.

In one example of the at least one non-transitory computer-readable medium, the instructions further instruct the at least one processor to control the DC/DC converter to provide the secondary power based on a reference power. In one example of the at least one non-transitory computer-readable medium, controlling the DC/DC converter to provide the secondary power based on the reference power includes controlling the secondary power to match the reference power, and controlling the PFC converter to provide the primary power includes controlling the primary power to supplement the secondary power to satisfy the load.

In another example of the at least one non-transitory computer-readable medium, the instructions further instruct the at least one processor to control the DC/DC converter to stop providing the secondary power in response to determining the SOH.

In one example of the at least one non-transitory computer-readable medium, the instructions further instruct the at least one processor to control the DC/DC converter to stop providing the secondary power in response to receiving the at least one of the charge or discharge parameter.

According to at least another aspect of the present disclosure, a method of controlling an uninterruptible power supply (UPS) including a first input configured to be coupled to a primary power source, a power factor correction (PFC) converter coupled to the first input, a second input configured to be coupled to a secondary power source, a DC/DC converter coupled to the second input, and an output configured to be coupled to a load is disclosed, the method including controlling the DC/DC converter to provide secondary power derived from the secondary power source to the output; controlling, while an amount of power available from the primary power source is sufficient to satisfy the load, the PFC converter to output primary power derived from the primary power source to the output in parallel with the DC/DC converter providing the secondary power to the output; receiving at least one of a charge or discharge parameter associated with the secondary power source; and determining a state of health (SOH) of the secondary power source based on the at least one of the charge or discharge parameter.

In one example, the method further includes controlling the DC/DC converter to provide the secondary power based on a reference power. In one example of the method, controlling the DC/DC converter to provide the secondary power based on the reference power includes controlling the secondary power to match the reference power, and controlling the PFC converter to provide the primary power includes controlling the primary power to supplement the secondary power to satisfy the load.

In one example, the method further includes controlling the DC/DC converter to stop providing the secondary power in response to determining the SOH.

In another example, the method further includes controlling the DC/DC converter to stop providing the secondary power in response to receiving the at least one of the charge or discharge parameter.

BRIEF DESCRIPTION OF THE DRAWINGS

Various aspects of at least one embodiment are discussed below with reference to the accompanying figures, which may not be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or substantially similar component that is illustrated in various figures may be represented by a like numeral. For purposes of clarity, not every component may be labeled in every figure. In the figures:

DETAILED DESCRIPTION

Figure 1:
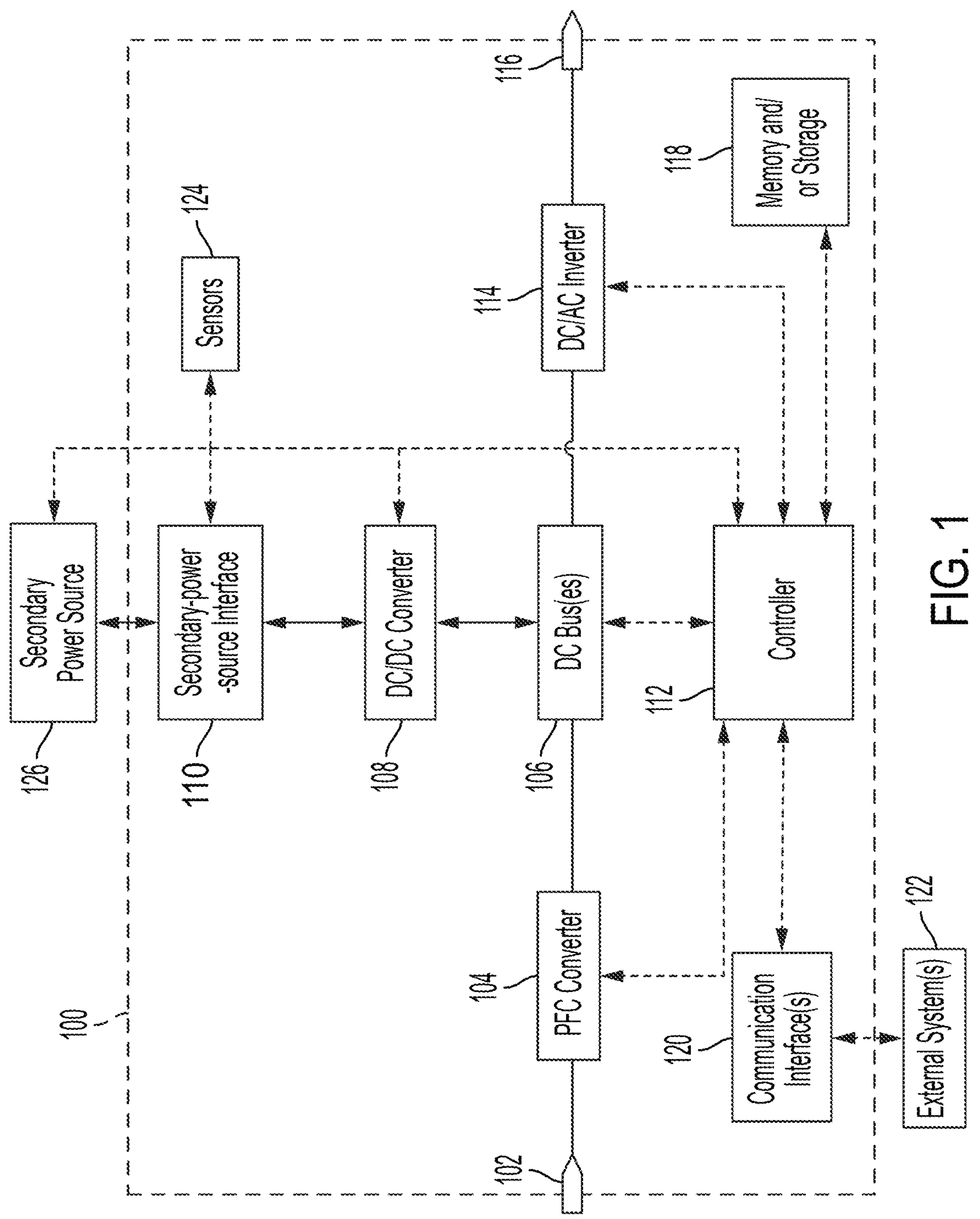
FIG. 1 illustrates a block diagram of an uninterruptible power supply (UPS) according to an example.

As discussed above, an uninterruptible power supply (UPS) may be used to provide regulated, uninterruptible power to one or more loads at an output of the UPS. An example UPS may include at least two inputs. A first input is configured to be coupled to a primary power source (including, for example, a utility mains supply) and a second input is configured to be coupled to a secondary power source (including, for example, one or more energy-storage devices, such as batteries). If acceptable power is available from the primary power source, the UPS may draw power from the primary power source along a first power path from the first input to the output. This mode of operation may be referred to as an online mode. If acceptable power is not available from the primary power source, the UPS may draw power from the secondary power source along a second power path from the second input to the output. This mode of operation may be referred to as a battery mode.

The first and second power paths may each pass through one or more converters, such as power factor correction (PFC) converters, DC/AC converters (also referred to as inverters), and/or DC/DC converters. For some example UPSs, the first power path may extend from the first input to the output through a PFC converter, a DC bus, and a DC/AC converter, and the second power path may extend from the second input to the output through a DC/DC converter, the DC bus, and the DC/AC converter.

In various examples, a UPS may determine a state-of-health (SOH) of a secondary power source (for example, a battery) based on charge and/or discharge parameters acquired while the secondary power source is being charged and/or discharged. In some examples, however, the UPS may not draw power from the secondary power source until acceptable power from the primary power source becomes unavailable. If the primary power source continues to be acceptable for a long period of time, the secondary power source may remain idle and unused during that long period. Because the secondary power source is not charged or discharged during this idle period, the UPS may not be able to acquire charge and/or discharge parameters, and thus may not be able to determine the SOH of the secondary power source. In some examples, the secondary power source may be an energy-storage device including one or more batteries that may nevertheless deteriorate in health or other statuses over idling periods. Such deterioration may be due to various factors such as aging and ambient temperature fluctuations.

Accordingly, there may be long idle periods during which the SOH of the UPS battery is not evaluated. This may cause certain issues during the continued operation of the UPS. For example, because the user is unaware of the reduced lifetime of the UPS battery due to the unknown SOH deterioration, the UPS battery may not be replaced or maintained regularly enough.

Examples of the present disclosure include a method to monitor the battery status (such as the SOH) of a UPS without requiring a primary power source downtime or UPS hardware change. In certain examples, a hybrid mode of operation of the UPS, different from the online mode or battery mode, may be implemented in which both the primary power source and the UPS battery may be controlled to simultaneously provide power to the external load of the UPS so that the UPS battery may be discharged and/or charged even when the primary power source is acceptable. Such discharging and/or charging of the UPS battery may allow the UPS to determine the battery status (such as SOH) according to a pre-determined time schedule, randomly, at the user's request, or according to some other schedule.

FIG. 1 illustrates a block diagram of a UPS 100 according to an example. The UPS 100 may include an input 102, a PFC converter 104, one or more DC buses 106, a DC/DC converter 108, a secondary-power-source interface 110, at least one controller 112 ("controller 112"), a DC/AC inverter 114, an output 116, a memory and/or storage 118, one or more communication interfaces 120 ("communication interfaces 120") which may be communicatively coupled to one or more external systems 122 ("external systems 122"), and one or more voltage sensors and/or current sensors 124 ("sensors 124").

The input 102 may be coupled to the PFC converter 104 and to an AC power source (not illustrated), such as an AC mains power supply. The PFC converter 104 may be coupled to the input 102 and to the one or more DC buses 106, and may be communicatively coupled to the controller 112. The one or more DC buses 106 may be coupled to the PFC converter 104, the DC/DC converter 108, and to the DC/AC inverter 114, and may be communicatively coupled to the controller 112. The DC/DC converter 108 may be coupled to the one or more DC buses 106 and to the secondary-power-source interface 110, and may be communicatively coupled to the controller 112. The secondary-power-source interface 110 may be coupled to the DC/DC converter 108, and may be configured to be coupled to at least one secondary power source 126. In some examples, the secondary-power-source interface 110 is configured to be communicatively coupled to the controller 112.

In some examples, the UPS 100 may be external to the at least one secondary-power-source 126 and may be coupled to the at least one secondary-power-source 126 via the secondary-power-source interface 110. In various examples, the UPS 100 may include one or more energy-storage devices, which may include the at least one secondary-power-source 126. The at least one secondary-power source 126 may include one or more batteries, capacitors, flywheels, or other energy-storage devices in various examples.

The DC/AC inverter 114 may be coupled to the one or more DC buses 106 and to the output 116, and may be communicatively coupled to the controller 112. The output 116 may be coupled to the DC/AC inverter 114, and to an external load (not illustrated). The controller 112 may be communicatively coupled to the PFC converter 104, the one or more DC buses 106, the DC/DC converter 108, the secondary-power-source interface 110, the DC/AC inverter 114, the memory and/or storage 118, the communication interfaces 120, and/or the at least one secondary power source 126. The sensors 124 may be communicatively coupled to the controller 112 and may be coupled to one or more other components of the UPS 100, such as the input 102, the PFC converter 104, the one or more DC buses 106, the DC/DC converter 108, the energy-storage-device interface 110, the DC/AC inverter 114, and/or the output 116.

The input 102 may be configured to be coupled to an AC mains power source and to receive input AC power having an input voltage level. The UPS 100 may be configured to operate in different modes of operation based on the input voltage of the AC power provided to the input 102. The controller 112 may determine a mode of operation in which to operate the UPS 100 based on whether the input voltage of the AC power is acceptable. The controller 112 may include or be coupled to one or more sensors, such as the sensors 124, configured to sense parameters of the input voltage. For example, the sensors 124 may include one or more voltage and/or current sensors coupled to the input 102 and may be configured to sense information indicative of a voltage at the input 102 and provide the sensed information to the controller 112.

In some examples, the sensors 124 may include one or more sensors coupled to one or more of the foregoing components such that a voltage and/or current of one or more of the foregoing components may be determined by the controller 112. The controller 112 may store information in, and/or retrieve information from, the memory and/or storage 118. For example, the controller 112 may store information indicative of sensed parameters (for example, input-voltage values of the AC power received at the input 102) in the memory and/or storage 118. The controller 112 may further receive information from, or provide information to, the communication interfaces 120. The communication interfaces 120 may include one or more communication interfaces including, for example, user interfaces (such as display screens, touch-sensitive screens, keyboards, mice, trackpads, dials, buttons, switches, sliders, light-emitting components such as light-emitting diodes, sound-emitting components such as speakers, buzzers, and so forth configured to output sound inside and/or outside of a frequency range audible to humans, and so forth), wired communication interfaces (such as wired ports), wireless communication interfaces (such as antennas), and so forth, configured to exchange information with one or more systems, such as the external systems 122, or other entities, such as human beings. The external systems 122 may include any device, component, module, and so forth, that is external to the UPS 100, such as a server, database, laptop computer, desktop computer, tablet computer, smartphone, central controller or data-aggregation system, other UPSs, and so forth.

Figure 2:
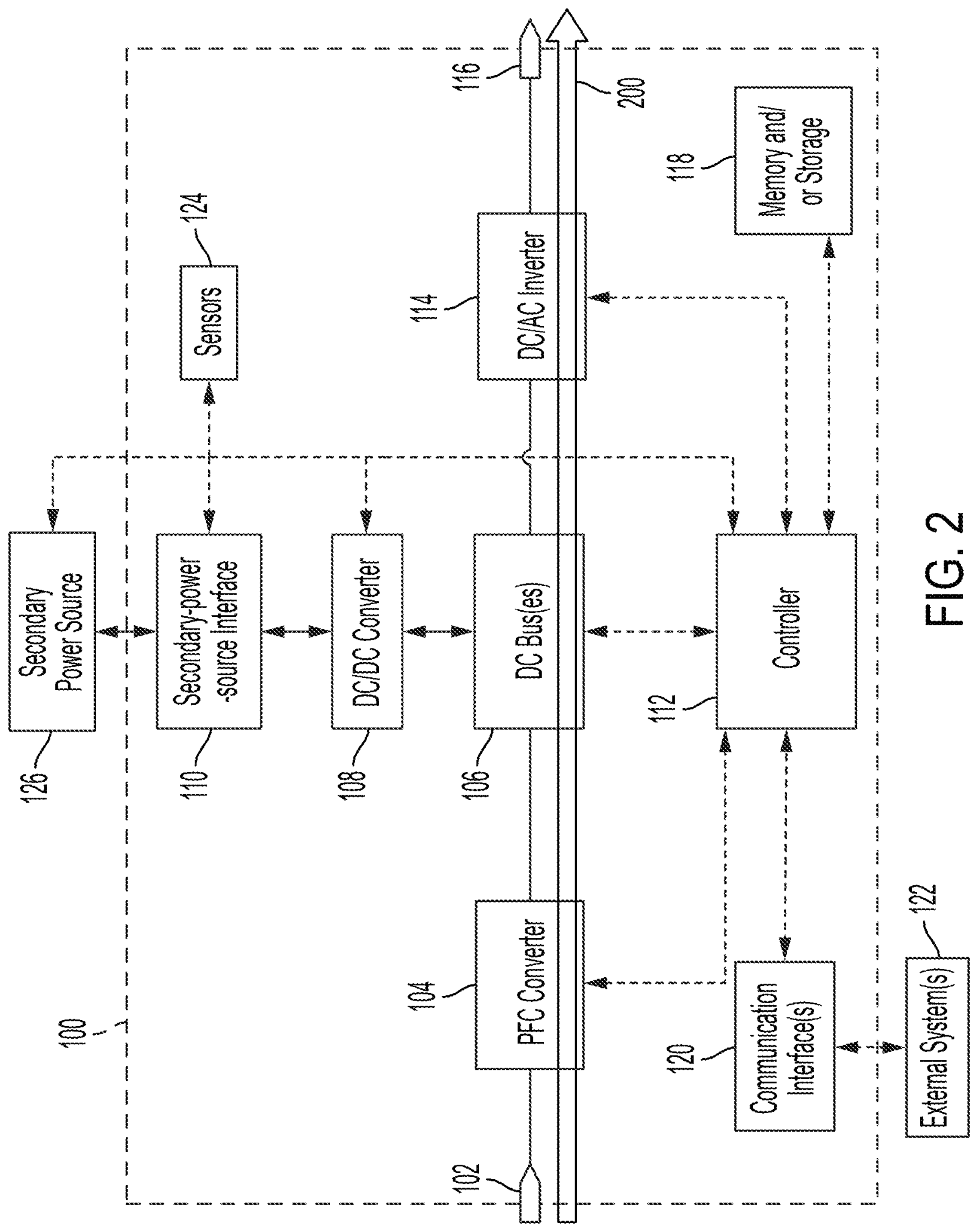
FIG. 2 illustrates power flow in an online mode of operation of the UPS of FIG. 1 according to an example.

FIG. 2 illustrates power flow in an online mode of operation of the UPS 100 of FIG. 1 according to an example.

When AC power provided to the input 102 from the AC mains power supply (that is, the primary power source) is acceptable (for example, by having parameters, such as an input voltage value, that meet specified values by, for example, falling within a range of acceptable input voltage values), the controller 112 may control components of the UPS 100 to operate in an online mode of operation to direct power from the input 102 to the output 116 through a first power path 200. In the online mode of operation, the PFC converter 104 draws AC power from the input 102. The PFC converter 104 converts the AC power into DC power and provides the DC power to the one or more DC buses 106. The one or more DC buses 106 distribute the DC power to the DC/DC converter 108 and to the DC/AC inverter 114. The DC/AC inverter 114 receives DC power from the one or more DC buses 106, converts the DC power into regulated AC power, and provides the regulated AC power to the output 116 to be delivered to a load.

If a UPS battery of the at least one secondary power source 126 is not fully charged, then the DC/DC converter 108 may draw power from the DC buses 106, convert the received DC power to converted DC power, and provide the converted DC power to the secondary-power-source interface 110. The secondary-power-source interface 110 receives the converted DC power and provides the converted DC power to the at least one secondary power source 126 to charge the at least one secondary power source 126. However, because the UPS battery of the at least one secondary power source 126 may not need to be charged while the UPS 100 continuously operates in the online mode, the UPS 100 may not estimate the SOH of the UPS battery of the at least one secondary power source 126 until the UPS 100 operates in a battery mode of operation.

Figure 3:
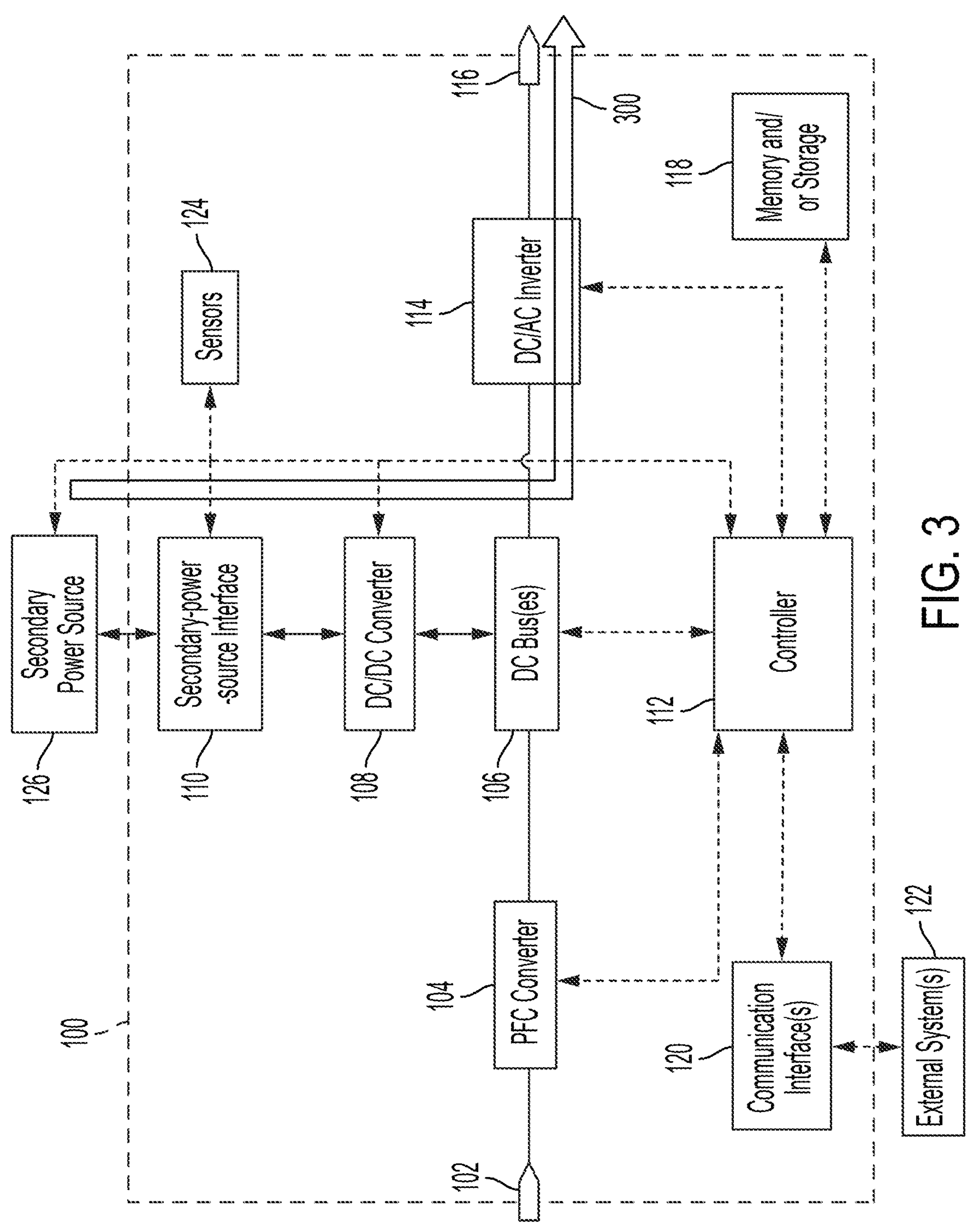
FIG. 3 illustrates power flow in a battery mode of operation of the UPS of FIG. 1 according to an example.

FIG. 3 illustrates the power flow in a battery mode of operation of the UPS 100 of FIG. 1 according to an example. When AC power provided to the input 102 from the AC mains power supply (primary power source) is not acceptable (for example, by having parameters, such as an input voltage value, that do not meet specified values by, for example, falling outside of a range of acceptable input voltage values), the controller 112 may control components of the UPS 100 to operate in a battery mode of operation to direct power from the UPS battery of the at least one secondary power source 126 to the output 116 through a second power path 300.

In the battery mode of operation, DC power is discharged from the UPS battery of the at least one secondary power source 126 to the secondary-power-source interface 110, and the secondary-power-source interface 110 provides the discharged DC power to the DC/DC converter 108. The DC/DC converter 108 converts the received DC power and distributes the DC power amongst the one or more DC buses 106. The one or more DC buses 106 provide the received power to the DC/AC inverter 114. The DC/AC inverter 114 receives the DC power from the one or more DC buses 106, converts the DC power into regulated AC power, and provides the regulated AC power to the output 116.

In the battery mode of operation, because DC power is discharged from the UPS battery of the at least one secondary power source 126, the SOH of the UPS battery may be estimated based on, for example, one or more discharge parameters, such as a discharge voltage or discharge current of the UPS battery. Subsequently, when the AC power from the AC mains power supply becomes acceptable, the previously discharged UPS battery of the at least one secondary power source 126 may be charged and the SOH of the UPS battery may also be estimated based on, for example, one or more charge parameters, such as a charge voltage or charge current of the UPS battery. In some examples, one or more charge and/or discharge parameters, such as the charge and/or discharge voltage or current of the UPS battery, may be measured by the sensors 124 and sent to the controller 112 for SOH estimation. However, the controller 112 may perform the SOH estimation only when charge and/or discharge parameters are available, such as when the UPS 100 operates in the battery mode.

Figure 4A:
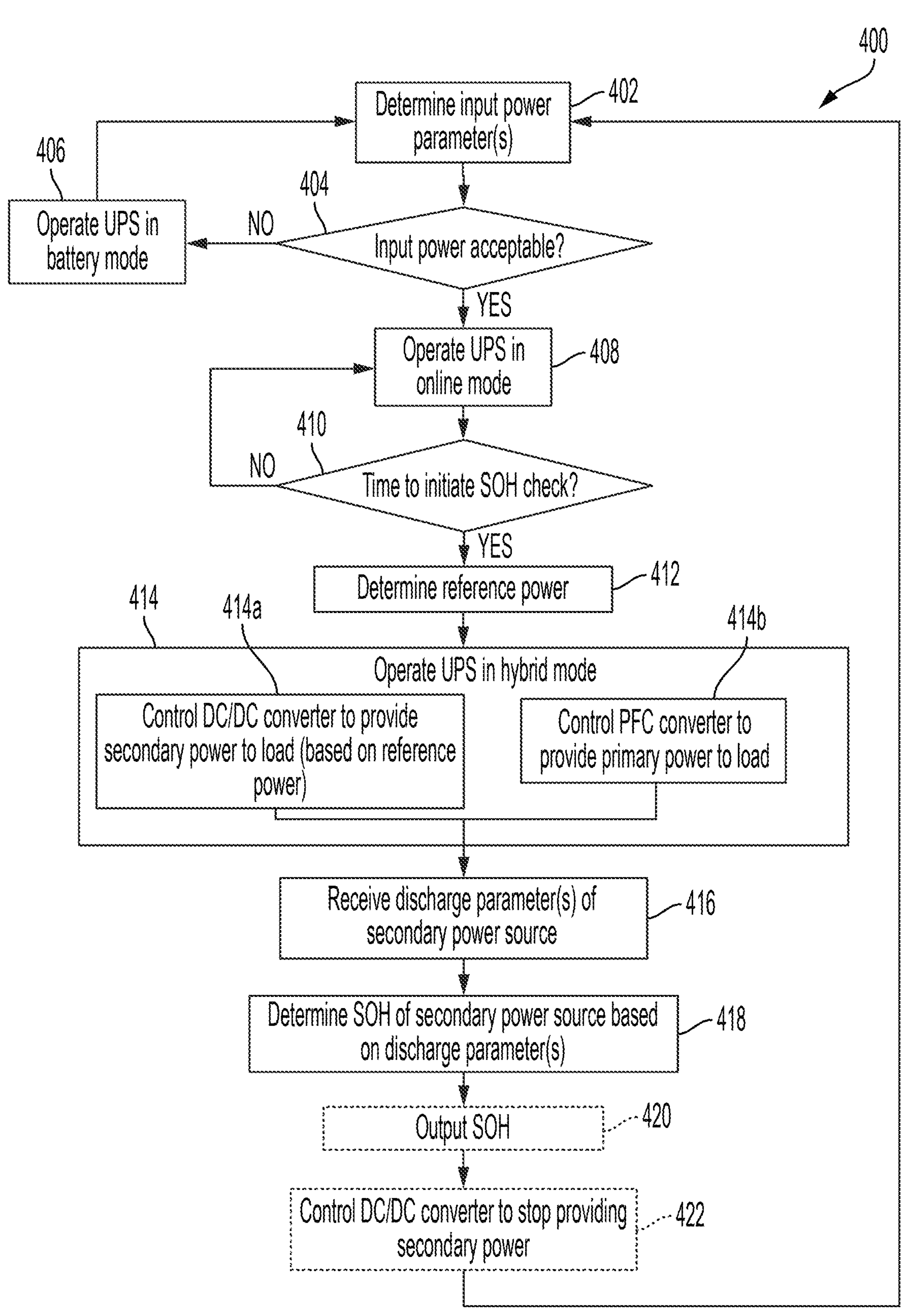
FIG. 4A illustrates a process of operating the UPS of FIG. 1 in a hybrid mode of operation according to an example.

To control the timing or frequency of the SOH estimation of the at least one secondary power source 126 without relying on an AC mains power supply downtime or any additional UPS hardware, a control method to operate the UPS 100 in a hybrid mode of operation is provided. FIG. 4A illustrates a process 400 to operate the UPS 100 in a hybrid mode of operation according to an example.

At act 402, in one example, the controller 112 may determine one or more input power parameters of the input AC power received from the AC mains power supply at the input 102. The one or more input power parameters may include an instant input voltage and/or an instant input current. The controller 112 may receive the input power parameters from the sensors 124. At act 404, in one example, the controller 112 may determine whether the input AC power is acceptable. In some examples, the controller 112 determining whether the input AC power is acceptable may include the controller 112 determining that the one or more input parameters fall within certain ranges or above or below certain threshold values, such as a voltage of the input power falling within an acceptable voltage range. If the controller 112 determines that the input AC power is not acceptable (404 NO), the process 400 may proceed to act 406.

At act 406, in one example, the controller 112 may operate the UPS 100 in a battery mode as described above with respect to FIG. 3. After the act 406, the process 400 may return to the act 402. Acts 402-406 may be repeated until the controller 112 determines that the input power is acceptable (404 YES). If the controller 112 determines that the input AC power is acceptable (404 YES), the process 400 may proceed to act 408.

At act 408, in one example, the controller 112 may operate the UPS 100 in the online mode while the AC power derived from the AC mains power supply (that is, the primary power source) is acceptable. At least because the input AC power may have parameters that the controller 112 determines are acceptable at act 404—YES, the input power may be sufficient to satisfy the external load. For example, the input power may provide an amount of power that is capable of meeting the demand of the external load coupled to the output 116. As discussed above with respect to FIG. 2, the controller 112 may operate the UPS 100 to provide power derived from the input 102 to the output 116 via the PFC converter 104, the DC buses 106, and the DC/AC inverter 114. In some examples, the controller 112 may also operate the UPS 100 to provide charging power derived from the input 102 to the at least one secondary power source 126 (if, for example, the at least one secondary power source 126 is not fully charged).

At act 410, in one example, the controller 112 may determine whether to initiate an SOH check on the UPS battery of the at least one secondary power source 126. As discussed above, the input power may be sufficient to satisfy the external load. Accordingly, satisfying the load requirements may not require that power be drawn from the at least one secondary power source 126, at least from a perspective of providing enough power at the output 116. However, as discussed above, extended periods without drawing power from the at least one secondary power source 126 may deprive the controller 112 of the opportunity to determine an SOH of the at least one secondary power source 126. Accordingly, act 410 may include the controller 112 determining whether to initiate an SOH check because, for example, a substantial amount of time has passed without charging or discharging the at least one secondary power source 126.

In some examples, act 410 may include the controller 112 determining whether a certain pre-determined amount of time has elapsed since an SOH of a UPS battery of the at least one secondary power source 126 was most recently determined. In some examples, a user may configure the pre-determined amount of time. In one example, the controller 112 may be configured to initiate SOH checks automatically according to a time schedule pre-determined by the user. In some examples, the time schedule may include periodic SOH check times. In certain examples, the time schedule may include conditions such as when the age of the UPS battery of the at least one secondary power source 126 reaches certain amounts. In other examples, the controller 112 may initiate an SOH check in response to a user request regardless of a pre-determined time schedule. In certain examples, the controller 112 may initiate an SOH check at a randomly selected time without a user request.

In some examples, a user may configure firmware of the controller 112 to input a proper SOH check time to the controller 112. If the controller 112 determines not to conduct an SOH check (410 NO), the process 400 may return to the act 408 to keep the UPS 100 operating in the online mode. Acts 408 and 410 may be repeatedly executed. In some examples, the controller 112 may wait to re-execute the act 410 until a time interval has elapsed. In some examples, the acts 408 and 410 may be repeated multiple times until it is the proper time to conduct an SOH check (410 YES) and the process 400 proceeds to act 412.

At act 412, in one example, the controller 112 may determine a reference power for operating the UPS 100 in a hybrid mode. The reference power may represent an amount of power to draw from the at least one secondary power source 126. Information acquired while drawing the reference power from the at least one secondary power source 126 may be used to determine the SOH of the at least one secondary power source 126. In some examples, the reference power may be a nonzero value below the instant output power at the output 116 as demanded by the external load. In some examples, the controller 112 may randomly determine the reference power. In other examples, the reference power may be a pre-determined value. For example, the reference power may be pre-determined to match the 20% value (or another nonzero percentage below 100%) of the instant power demand of the external load, or match a pre-determined magnitude of power.

At act 414, in one example, the controller 112 may operate the UPS 100 in a hybrid mode of operation. In some examples, the act 414 may include sub-acts 414*a* and 414*b* which may be executed sequentially or in parallel (that is, simultaneously).

At sub-act 414*a*, in one example, the controller 112 may control the DC/DC converter 108 to provide secondary power from the UPS battery of the at least one secondary power source 126 to the DC/AC inverter 114, and may control the DC/AC inverter 114 to provide power to the external load via the output 116. In some examples, the controller 112 may control the secondary power based on the reference power determined at the act 412. For example, the controller 112 may control the secondary power to match the reference power. In other examples, the controller 112 may use a pre-determined primary power value in the following acts without executing the act 412.

At sub-act 414*b*, the controller 112 may control the PFC converter 104 to provide primary power from the AC mains power supply (that is, the primary power source) to the DC/AC inverter 114, and may control the DC/AC inverter 114 to provide power to the external load via the output 116 to supplement the secondary power. In one example, if the secondary power is determined to be 20% of the power demand of the external load, the controller 112 may draw primary power to satisfy the remaining 80% of the power demand of the external load. By simultaneously providing power from the at least one secondary power source 126 and the AC mains power supply, the hybrid mode of operation allows the UPS battery to be discharged while the AC power from the AC mains power supply is still acceptable and sufficient to satisfy the external load.

Figure 5:
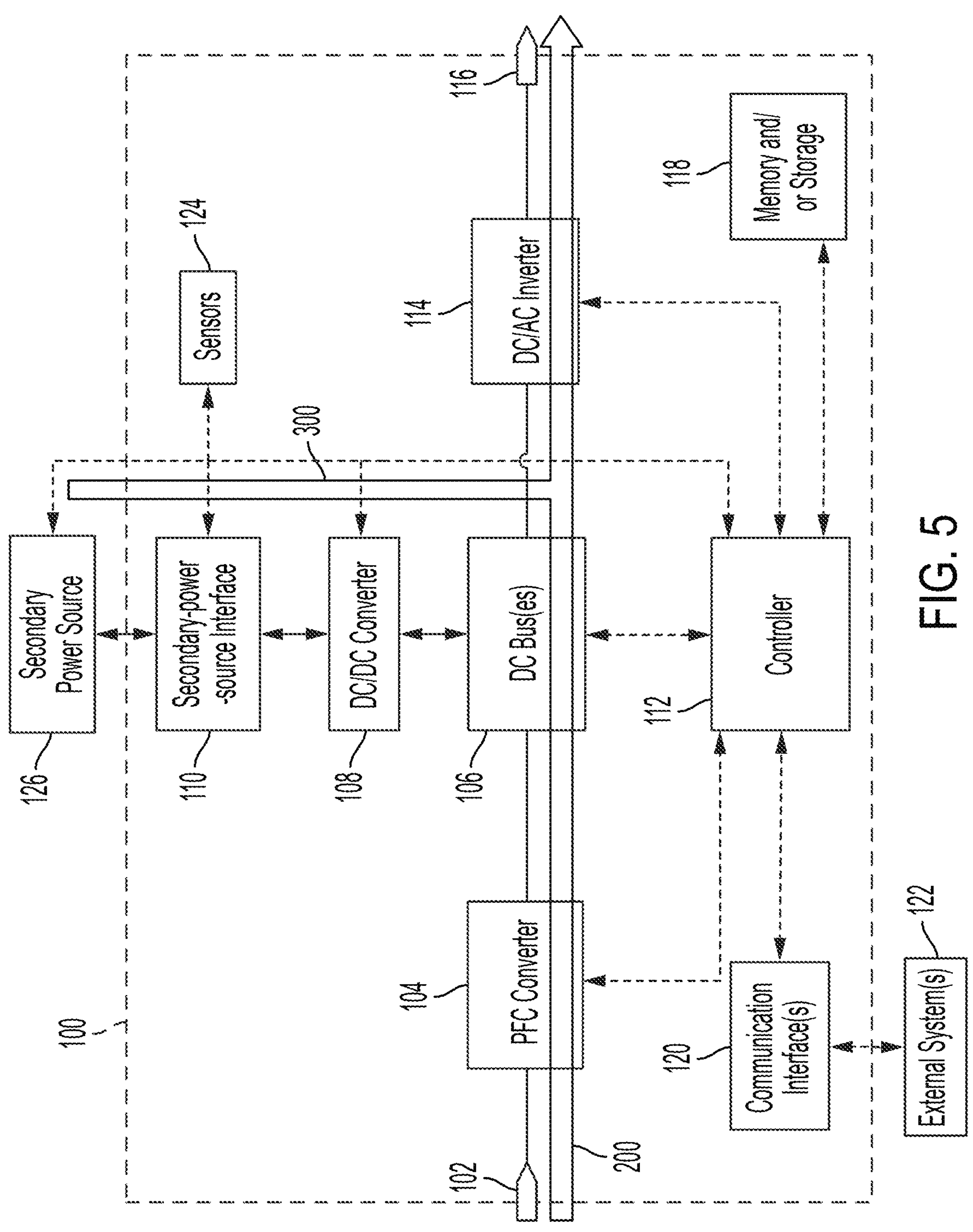
FIG. 5 illustrates power flow in a hybrid mode of operation of the UPS of FIG. 1 according to an example.

FIG. 5 illustrates power flow in a hybrid mode of operation of the UPS 100 of FIG. 1 according to an example. As described above, at act 414, the controller 112 operates the UPS 100 in the hybrid mode of operation to simultaneously provide primary power and secondary power to the external load. For example, the primary power may follow the first power path 200 and the secondary power may follow the second power path 300. In one example, the first power path 200 and the second power path 300 may merge at the one or more DC buses 106.

Returning to FIG. 4A, at act 416, in one example, the controller 112 may receive one or more discharge parameters of the UPS battery of the secondary power source 126. In one example, one or more discharge parameters, such as a discharge voltage and/or discharge current of the UPS battery of the at least one secondary power source 126, may be measured by the sensors 124 in the hybrid mode in FIG. 4A. In certain examples, the measured one or more discharge parameters of the UPS battery may be sent from the sensors 124 to the controller 112 to estimate the SOH of the UPS battery.

At act 418, in one example, the controller 112 may determine the SOH of the UPS battery of the secondary power source 126 based on the one or more discharge parameters. In at least one example, the controller 112 may access stored SOH-determination information in the memory and/or storage 118 indicating a relationship between the one or more discharge parameters and an SOH of the UPS battery of the at least one secondary power source 126. For example, a manufacturer of the UPS battery may provide the SOH-determination information, and the SOH-determination information may be stored in the memory and/or storage 118. In some examples, at the act 418, the controller 112 may also determine the state of charge (SOC) or other status-related parameters of the UPS battery based on the one or more discharge parameters.

At act 420, in one example, the controller 112 may output the determined SOH (and/or SOC) of the UPS battery to a user. In some examples, the controller 112 may also output an alarm signal to the user in response to the SOH of the UPS battery being below a threshold value, such as 80%. The alarm signal may prompt the user to replace or perform maintenance on the UPS battery to prevent future issues in operating the UPS 100 in the battery mode at the act 406.

At act 422, in one example, the controller 112 may control the DC/DC converter 108 to stop drawing secondary power from the at least one secondary power source 126. In some examples, the controller 112 may execute the act 422 after the act 414 and before the act 418 or 420. That is, in some examples, the controller 112 may control the DC/DC converter to stop providing secondary power responsive to having the discharge parameter(s) needed to determine an SOH, but before actually determining that SOH. In one example, after the act 422, the process 400 may return to the act 402. In some examples, responsive to having determined the SOH of the UPS battery, the controller 112 may resume operating the UPS 100 in the online mode at act 408; that is, the UPS 100 may resume drawing power only from the input 102 based on having completed the SOH determination.

Figure 4B:
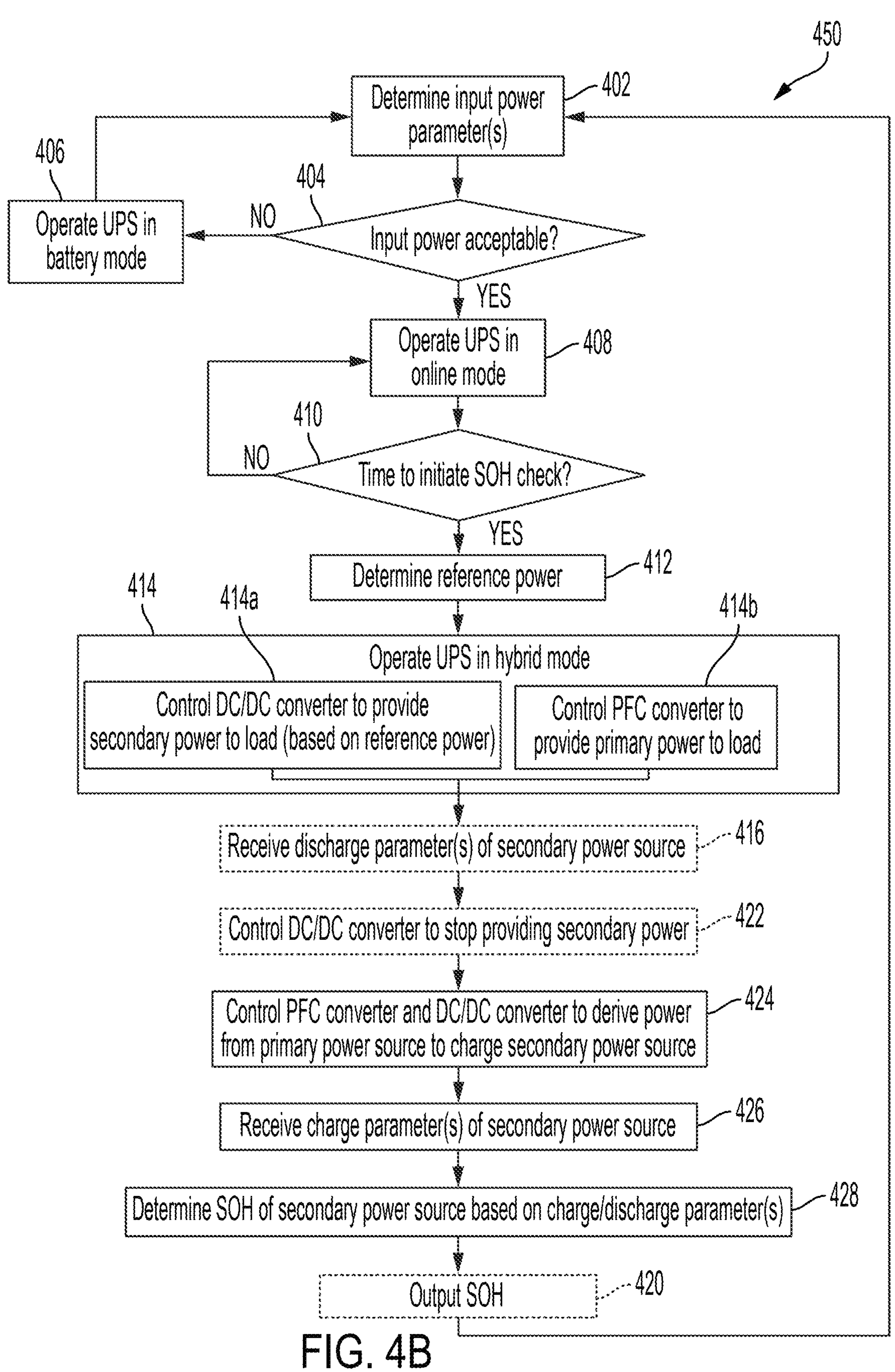
FIG. 4B illustrates a process of operating the UPS of FIG. 1 in a hybrid mode of operation according to another example.

In certain examples of a hybrid mode, after the discharge of the UPS battery is stopped at the act 422, the controller 112 may control the PFC converter 104 and the DC/DC converter 108 to provide power from the AC mains power supply to charge the UPS battery of the at least one secondary power source 126. FIG. 4B illustrates a process 450 to operate the UPS 100 in a hybrid mode of operation according to another example. In FIG. 4B, acts having the same reference numbers as those in FIG. 4A are substantially the same and descriptions for these acts thereof are not repeated for brevity. In particular, acts 402-416 and 422 may be substantially similar in FIGS. 4A and 4B, although act 422 may occur immediately after act 416 in the process 450.

After the controller 112 receives the discharge parameter(s) at act 422, however, the process 450 may continue to act 424.

At act 424, in one example, the controller 112 may control the PFC converter 104 and the DC/DC converter 108 to derive power from the input 112 to charge the UPS battery of the at least one secondary power source 126. In certain examples, at the act 424, the controller 112 may also simultaneously control the PFC converter 104 to provide primary power to the external load. In some examples, the act 424 may be performed after the UPS battery has been at least partially discharged at the act 414*a* and the controller has stopped discharging the UPS battery at the act 422.

Figure 6:
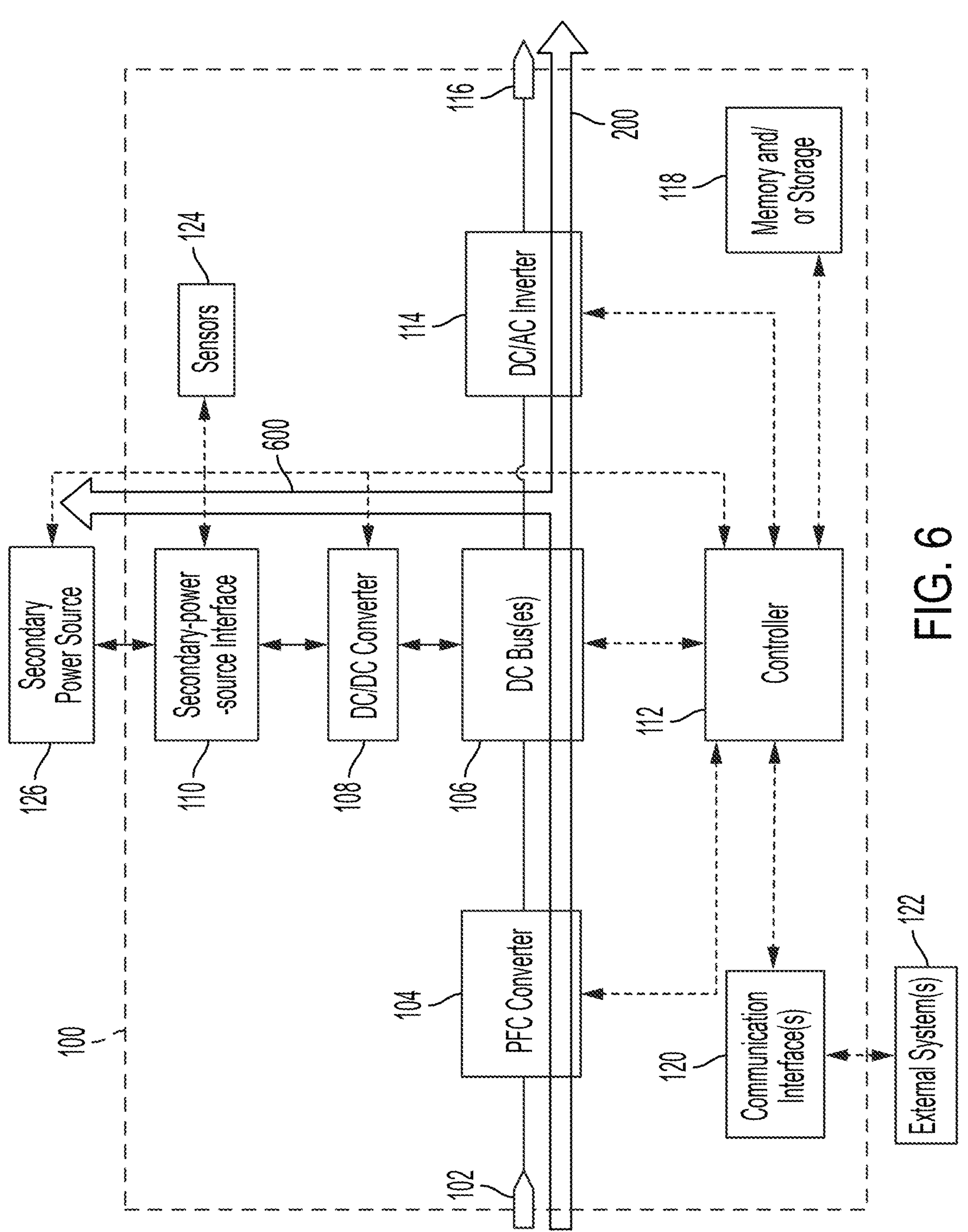
FIG. 6 illustrates power flow during a charging period of a UPS battery of the UPS of FIG. 1 according to an example.

FIG. 6 illustrates power flow during a charging period of the UPS battery of the at least one secondary power source 126 according to an example. At the act 424, the controller 112 may simultaneously direct primary power to the external load along the first power path 200 and direct primary power to the UPS battery of the at least one secondary power source 126 along a third power path 600. For example, the controller 112 may control the PFC converter 104 to convert the AC power received at the input 102 to DC power and direct the DC power to the DC buses 106. The controller 112 may then control the DC/DC converter 108 to direct a portion of the DC power of the DC buses 106 to the UPS battery of the at least one secondary power source 126 through the secondary-power-source interface 110. The controller 112 may also control the DC/AC inverter 114 to convert another portion of the DC power of the DC buses 106 into AC power and output the converted AC power to the output 116 to satisfy the external load. In one example, the power paths 200 and 600 may be illustrated as diverging at the one or more DC buses 106.

At act 426, in one example, the controller 112 may receive one or more charge parameters of the UPS battery of the at least one secondary power source 126. In some examples, the sensors 124 may sense the one or more charge parameters when the UPS battery is charged at the act 424 and send the one or more charge parameters to the controller 112. For example, the charge parameter(s) may include a charge current provided to the UPS battery, and/or may include a charge voltage applied to the UPS battery.

At act 428, in one example, the controller 112 may determine an SOH of the UPS battery of the at least one secondary power source 126 based on the one or more discharge parameters and/or one or more charge parameters. For example, a manufacturer of the UPS battery may provide the SOH-determination information, and the SOH-determination information may be stored in the memory and/or storage 118. The controller 112 may compare the charge and/or discharge parameters to the SOH-determination information to determine the SOH of the UPS battery. In some examples, at the act 428, the controller 112 may also determine the SOC or other status-related parameters of the UPS battery based on the one or more discharge parameters and/or the one or more charge parameters. The process 450 may then proceed to the act 420 and subsequently return to the act 402, as described above with respect to FIG. 4A.

Certain acts of the processes 400 and 450 are described as occurring in sequence solely for purposes of explanation rather than limitation. In many implementations, certain acts of the processes 400 and 450 may be executed in different orders and/or in parallel with one another. Accordingly, no limitation is implied by the order of the acts in the processes 400 and 450. At least a portion of the processes 400 and 450 may be implemented by the user using the controller 112.

As discussed above, the controller 112 may operate the UPS 100 in a hybrid mode to provide output power derived from both the input 102 and the at least one secondary power source 126 to the output 116. In one example, the controller 112 may execute a DC/DC converter control loop to control the DC/DC converter 108 to provide secondary power to the external load and simultaneously execute a PFC converter control loop to control the PFC converter 104 to provide primary power to the external load. The DC/DC converter control loop may include calculating and controlling a discharge current of the UPS battery based on the reference power, a sensed voltage of the UPS battery, and a sensed current of the UPS battery. In one example, the DC/DC converter control loop may include a firmware switch which controls when the controller 112 initiates the discharge of the UPS battery. The firmware switch may correspond to the act 410 and only be turned on when it is the proper time to initiate an SOH check, as described above regarding the act 410.

The PFC converter control loop may include calculating and controlling a current of the primary power to supplement the secondary power to satisfy the external load. In one example, calculating the current of the primary power may include calculating a DC voltage difference between a sensed output DC voltage of the PFC converter 104 and a reference DC voltage of the reference power and calculating the current of the primary power based on the DC voltage difference. Controlling the current of the primary power may then be performed based on the calculated current of the primary power and a sensed PFC inductor current passing through an inductor of the PFC converter 104.

In some examples, the DC/DC converter control loop and the PFC converter control loop may be implemented by configuring UPS firmware and/or software, which may not necessitate a hardware change to the UPS 100. For example, the voltage of the UPS battery and the PFC inductor current may be sensed by the sensors 124 already included in the UPS 100.

Various controllers, such as the controller 112, may execute various operations discussed above. The controller 112 may also execute one or more instructions stored on one or more non-transitory computer-readable media, which the controller 112 may include and/or be coupled to, which may result in manipulated data. The non-transitory computer-readable media may include memory and/or storage. In some examples, the controller 112 may include one or more processors or other types of controllers. In one example, the controller 112 is or includes at least one processor. In another example, the controller 112 performs at least a portion of the operations discussed above using an application-specific integrated circuit tailored to perform particular operations in addition to, or in lieu of, a processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An uninterruptible power supply (UPS), comprising:
- a first input configured to be coupled to a primary power source;
- a power factor correction (PFC) converter coupled to the first input;
- a second input configured to be coupled to a secondary power source;
- a DC/DC converter coupled to the second input;
- an output configured to be coupled to a load; and
- at least one controller configured to:
  - control the DC/DC converter to provide secondary power derived from the secondary power source to the output,
  - control, while an amount of power available from the primary power source is sufficient to satisfy the load, the PFC converter to provide primary power derived from the primary power source to the output in parallel with the DC/DC converter providing the secondary power to the output,
  - receive at least one of a charge or discharge parameter associated with the secondary power source, and
  - determine a state of health (SOH) of the secondary power source based on the at least one of the charge or discharge parameter.

2. The UPS of claim 1, wherein the at least one controller is further configured to control the DC/DC converter to provide the secondary power based on a reference power.

3. The UPS of claim 2, wherein controlling the DC/DC converter to provide the secondary power based on the reference power includes controlling the secondary power to match the reference power, and controlling the PFC converter to provide the primary power includes controlling the primary power to supplement the secondary power to satisfy the load.

4. The UPS of claim 1, wherein the at least one controller is further configured to control the DC/DC converter to stop providing the secondary power in response to determining the SOH.

5. The UPS of claim 1, wherein the at least one controller is further configured to control the DC/DC converter to stop providing the secondary power in response to receiving the at least one of the charge or discharge parameter.

6. The UPS of claim 1, wherein the at least one controller is further configured to control the DC/DC converter to provide the secondary power based on a reference power according to a predetermined time schedule.

7. The UPS of claim 6, wherein the predetermined time schedule is periodic.

8. The UPS of claim 1, wherein the at least one controller is further configured to output the SOH of the secondary power source, wherein outputting the SOH of the secondary power source includes outputting an alarm signal in response to the SOH being below a threshold value.

9. The UPS of claim 1, wherein:
- the PFC converter includes an inductor coupled to a DC bus of the UPS;
- the at least one controller is further configured to control the DC/DC converter to provide the secondary power based on a reference power; and
- controlling the PFC converter to provide the primary power includes determining a current of the inductor based on the reference power and a voltage of the DC bus.

10. The UPS of claim 1, wherein the secondary power source includes one or more batteries.

11. At least one non-transitory computer-readable medium storing thereon sequences of computer-executable instructions for controlling an uninterruptible power supply (UPS) including a first input configured to be coupled to a primary power source, a power factor correction (PFC) converter coupled to the first input, a second input configured to be coupled to a secondary power source, a DC/DC converter coupled to the second input, and an output configured to be coupled to a load, the sequences of computer-executable instructions including instructions that instruct at least one processor to:
- control the DC/DC converter to provide secondary power derived from the secondary power source to the output;
- control, while an amount of power available from the primary power source is sufficient to satisfy the load, the PFC converter to provide primary power derived from the primary power source to the output in parallel with the DC/DC converter providing the secondary power to the output;
- receive at least one of a charge or discharge parameter associated with the secondary power source; and
- determine a state of health (SOH) of the secondary power source based on the at least one of the charge or discharge parameter.

12. The at least one non-transitory computer-readable medium of claim 11, wherein the instructions further instruct the at least one processor to control the DC/DC converter to provide the secondary power based on a reference power.

13. The at least one non-transitory computer-readable medium of claim 12, wherein controlling the DC/DC converter to provide the secondary power based on the reference power includes controlling the secondary power to match the reference power, and controlling the PFC converter to provide the primary power includes controlling the primary power to supplement the secondary power to satisfy the load.

14. The at least one non-transitory computer-readable medium of claim 11, wherein the instructions further instruct the at least one processor to control the DC/DC converter to stop providing the secondary power in response to determining the SOH.

15. The at least one non-transitory computer-readable medium of claim 11, wherein the instructions further instruct the at least one processor to control the DC/DC converter to stop providing the secondary power in response to receiving the at least one of the charge or discharge parameter.

16. A method of controlling an uninterruptible power supply (UPS) including a first input configured to be coupled to a primary power source, a power factor correction (PFC) converter coupled to the first input, a second input configured to be coupled to a secondary power source, a DC/DC converter coupled to the second input, and an output configured to be coupled to a load, the method comprising:

controlling the DC/DC converter to provide secondary power derived from the secondary power source to the output;

controlling, while an amount of power available from the primary power source is sufficient to satisfy the load, the PFC converter to output primary power derived from the primary power source to the output in parallel with the DC/DC converter providing the secondary power to the output;

receiving at least one of a charge or discharge parameter associated with the secondary power source; and determining a state of health (SOH) of the secondary power source based on the at least one of the charge or discharge parameter.

17. The method of claim 16, further comprising controlling the DC/DC converter to provide the secondary power based on a reference power.

18. The method of claim 17, wherein controlling the DC/DC converter to provide the secondary power based on the reference power includes controlling the secondary power to match the reference power, and controlling the PFC converter to output the primary power includes controlling the primary power to supplement the secondary power to satisfy the load.

19. The method of claim 16, further comprising controlling the DC/DC converter to stop providing the secondary power in response to determining the SOH.

20. The method of claim 16, further comprising controlling the DC/DC converter to stop providing the secondary power in response to receiving the at least one of the charge or discharge parameter.

* * * * *